United States Patent [19]

Farhoomand et al.

[11] Patent Number: 5,291,055
[45] Date of Patent: Mar. 1, 1994

[54] RESONANT INFRARED DETECTOR WITH SUBSTANTIALLY UNIT QUANTUM EFFICIENCY

[75] Inventors: Jam Farhoomand, Palo Alto; Robert E. McMurray, Jr., Alameda, both of Calif.

[73] Assignee: The United States of America as represented by the Administrator of National Aeronautics and Space Administration, Washington, D.C.

[21] Appl. No.: 827,177

[22] Filed: Jan. 28, 1992

[51] Int. Cl.$^5$ .................. H01L 27/14; H01L 31/00
[52] U.S. Cl. ...................... 257/437; 257/436; 250/370.14
[58] Field of Search ............... 257/436, 437, 458, 443, 257/448; 250/330, 332, 370.01, 370.14

[56] References Cited

U.S. PATENT DOCUMENTS

| | | | |
|---|---|---|---|
| 4,419,533 | 12/1983 | Czubatyj et al. | 136/259 |
| 4,586,068 | 4/1986 | Petroff et al. | 357/30 |
| 4,775,881 | 10/1988 | Ploog et al. | 357/30 |
| 4,875,084 | 10/1989 | Tohyama | 257/436 |
| 4,896,202 | 1/1990 | Bharat et al. | 357/30 |
| 4,908,686 | 3/1990 | Maserjain | 357/30 |
| 5,122,669 | 6/1992 | Herring et al. | 257/466 |

OTHER PUBLICATIONS

Fowles, G., *Introduction to Modern Optics*, Holt, Rinehart, 1975, pp. 96–99.

*Primary Examiner*—Sara W. Crane
*Attorney, Agent, or Firm*—Darrell G. Brekke; Guy Miller; John R. Manning

[57] ABSTRACT

A resonant infrared detector includes an infrared-active layer which has first and second parallel faces and which absorbs radiation of a given wavelength. The detector also includes a first tuned reflective layer, disposed opposite the first face of the infrared-active layer, which layer reflects a specific portion of the radiation incident thereon and allows a specific portion of the incident radiation at the given wavelength to reach the infrared-active layer. A second reflective layer, disposed opposite the second face of the infrared-active layer, reflects back into the infrared-active layer substantially all of the radiation at the given wavelength which passes through the infrared-active layer. The reflective layers have the effect of increasing the quantum efficiency of the infrared detector relative to the quantum efficiency of the infrared-active layer alone.

21 Claims, 2 Drawing Sheets

RESONANT INFRARED DETECTOR WITH SUBSTANTIALLY UNIT QUANTUM EFFICIENCY

ORIGIN OF THE INVENTION

The invention described herein was made in the performance of work under a NASA contract and is subject to the provisions of Section 305 of the National Aeronautics and Space Act of 1958, Public Law 85-568 (72 Stat. 426; 42 U.S.C. 2457).

BACKGROUND OF THE INVENTION

1. Field of the Invention

The present invention relates to an infrared photodetector with improved or enhanced quantum efficiency.

2. The Prior Art

One of the primary objectives of the future projects for space-based observatories, such as the Space Infrared Telescope Facility (SIRTF) and the Large Deployable Reflector (LDR), is to make background-limited astronomical observations. In order to fully realize this objective, the requirements on detector characteristics, in terms of responsivity and noise equivalent power (NEP), have necessarily become more stringent. In addition, detectors will have to withstand the ionizing radiation environment of the high earth orbit. Several approaches have been adopted in the past to improve the fundamental characteristics of an infrared photoconductor. The quantum efficiency, which is perhaps the single most important parameter or defining characteristic, can be enhanced by increasing the absorption depth of the detector. An increased absorption depth can be achieved by geometrical means, by increasing the dopant concentration or by both. These approaches can have serious drawbacks, especially for low-background astronomy.

Increasing the dopant concentration will improve the absorption coefficient but, at the same time, will increase the leakage current. High leakage current and hopping conduction degrade the noise performance of the detector. In an impurity-band-conduction (IBC) detector, the attempt is made to overcome this problem by growing a high purity epitaxial layer on the top of the active layer. An IBC detector can, therefore, theoretically take advantage of a very high dopant concentration with improved NEP because of this blocking epitaxy. Although the IBC concept has been successfully demonstrated for mid-infrared silicon detectors, the technology for far infrared detectors is considerably less than optimum.

Given an acceptable dopant concentration and aside from increasing the physical length of the detector element, several geometrical schemes can be used to increase the optical length of a detector. One of the most common methods involves the utilization of an integrating cavity behind the detector to refocus the light that is not absorbed back onto the detector so as to increase the chances of the light being absorbed. In another approach, the exit end of the detector is beveled at the proper angle to induce total internal reflection. Both of these methods have been successful in increasing the quantum efficiency by up to a factor of 3. Although these approaches are easily implemented on a single discrete detector, such approaches pose a formidable engineering task where an integrated detector array is to be produced.

SUMMARY OF THE INVENTION

It is an object of the present invention to provide an infrared photodetector having essentially unit quantum efficiency and an enhanced photoconductive gain, while at the same time keeping the physical length of the photodetector element relatively short and the dopant concentration low. In general, the present invention accomplishes this object through the provision of a tuned reflectance resonant absorption-cavity which is internal to the detector element.

An infrared detector in accordance with the invention comprises:

an infrared-active layer for absorbing radiation of a given wavelength and having first and second essentially parallel faces;

a first reflective layer, disposed opposite the first face of the infrared-active layer and having a reflectivity tuned to the absorptivity of the infrared-active layer, for reflecting a specific portion of radiation incident on the first reflective layer during each pass of the radiation through the detector and for allowing a specific portion of the incident radiation at the given wavelength to reach the infrared-active layer; and a second reflective layer, disposed opposite the second face of the infrared-active layer, for reflecting back into the infrared-active layer substantially all of the radiation at the given wavelength which passes through the infrared-active layer, whereby the first and second reflective layers increase the quantum efficiency of the infrared detector relative to the quantum efficiency of the infrared-active layer alone.

Other features and advantages of the invention will be set forth in, or apparent from, the following detailed description of preferred embodiments of the invention.

DETAILED DESCRIPTION OF THE INVENTION

Figure 1:
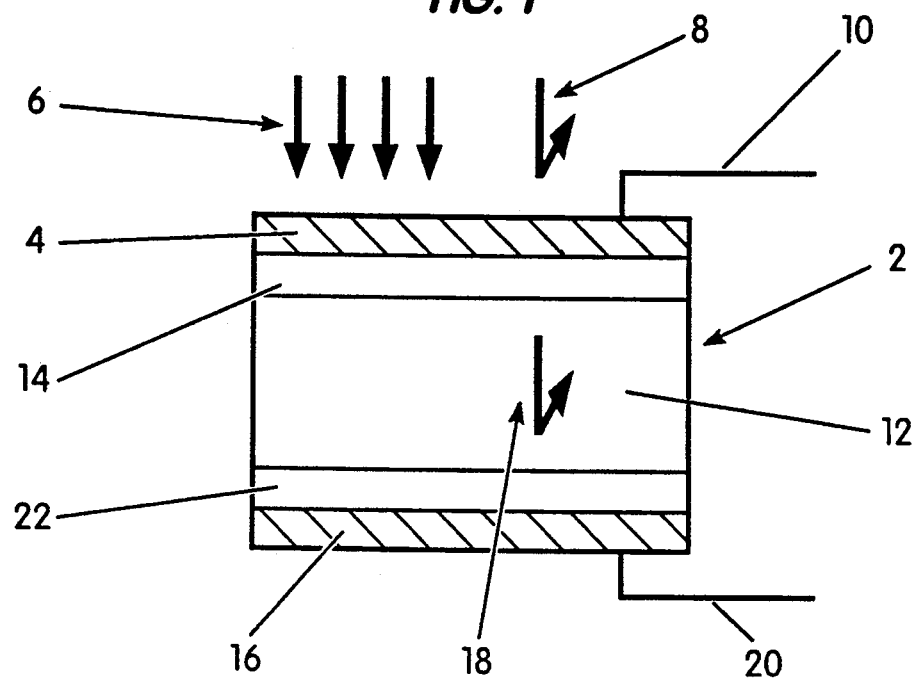
FIG. 1 is a diagrammatic cross-sectional view of a resonant infrared detector constructed in accordance with a preferred embodiment of the invention.

FIG. 1 illustrates in cross-section a typical infrared detector according to the invention. The detector, which is generally denoted 2, includes a tuned reflective layer 4 on which radiation is incident, as indicated by arrows 6. Part of the amplitude of the radiation is reflected by front surface 4 as indicated by arrows 8. Reflective layer 4 is of a particular form or pattern which allows the reflectivity thereof to be controlled to a desired value. One method to form reflective layer 4 is to deposit a uniform film of a low loss metal such as gold or a gold alloy. In the case of gold, the thickness of the film determines the reflectivity of reflective layer 4. Another method which can be used to form reflective layer 4 is to deposit a low loss metal film in a mesh pattern. The reflectivity of the mesh pattern is determined by the geometrical size of the mesh. An electrical contact or connection 10 is attached to the reflective metallic layer 4 in order to establish an electric field across detector 2.

Detector 2 further includes an infrared-active layer 12. Incident radiation is absorbed and the detection of radiation takes place in the infrared-active layer 12 which is located beneath the reflective layer 4. Any infrared sensing medium, such as germanium or silicon, can be used for infrared-active layer 12.

When a semiconductor material such as germanium or silicon is used in infrared-active layer 12, a transparent contact layer, indicated at 14, is used to join reflective layer 4 to infrared-active layer 12. Transparent contact layer 14 is preferably made of an ion-implanted degenerately doped (metal-like) semi-conductor material which is nonabsorbing to the incident radiation and is at the same time electrically conductive so that a uniform electric field can be applied across detector 2. For certain detectors made according to the present invention, transparent contact layer 14 may not be needed, and reflective layer 4 is used directly as a contact electrode.

Behind or beneath infrared-active layer 12 is a second reflective layer 16 which reflects, as indicated by arrow 18, substantially 100% of the light which passes through infrared-active layer 12 and falls on second reflective layer 16. Reflective layer 16 can be made by depositing a low loss metal, such as gold or gold alloy, as a uniform film, on a mesh pattern, or in any other form that can be made totally reflective. A second electrical contact 20 is attached to reflective layer 16 in order to establish an electric field across detector 2.

A second transparent contact layer 22 is preferably placed between reflective layer 16 and infrared-active layer 12. Transparent contact layer 22, like transparent contact layer 14, is preferably made of an ion-implanted degenerately doped (metal-like) semi-conductor material which is nonabsorbing to the incident radiation and is at the same time electrically conductive so that a uniform electric field can be applied across detector 2. For certain detectors made according to the present invention, transparent layer 22 may not be needed, and the second reflective layer 16 is used directly as a contact electrode.

Figure 2:
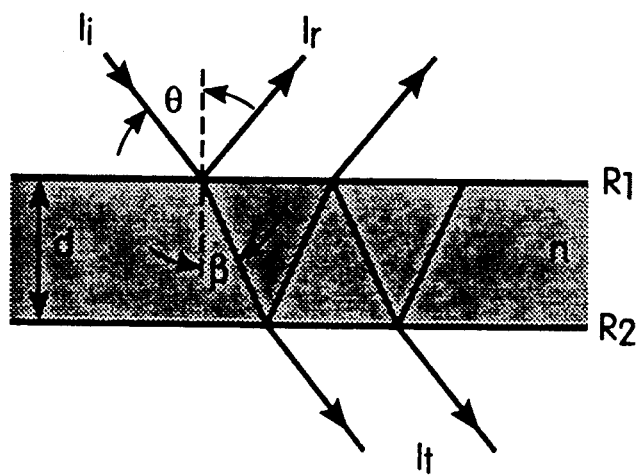
FIG. 2 a schematic representation of a detector layer and illustrates the reflection and transmission of a light beam which is incident on the detector of FIG. 1.

The theory behind the operation of the infrared detector of the present invention will now be described with reference to FIG. 2. FIG. 2 shows a detector layer having a thickness d and index of refraction n. The faces of this detector layer, which are made parallel to within very close tolerances, constitute the end reflectors of a Fabry-Perot etalon. If the thickness d of the layer is selected so that $d = m\lambda_0/2n$, where m is an integer and $\lambda_0$ is a desired vacuum wavelength within the spectral response of the detector, the detector will be resonantly absorptive and the standard relationships governing a lossy Fabry-Perot resonator will apply. The effective absorption coefficient of this resonant detector can be formulated as follows:

Let a plane wave of intensity $I_i$ be incident on this detector at an angle $\theta$ to the normal, as depicted in FIG. 2. If a double pass through the detector introduces a phase delay $\phi$, then $\phi$ is given by $$\phi = \frac{4\pi n d (\cos\theta)}{\lambda_0} \quad (1)$$

The superposition of the partially reflected waves gives rise to a total intensity $I_r$, and is given by:

$$\frac{I_r}{I_i} = \frac{(\sqrt{R_1} - A\sqrt{R_2})^2 + 4A\sqrt{R_1 R_2}\sin^2\left(\frac{\phi}{2}\right)}{(1 - A\sqrt{R_1 R_2})^2 + 4A\sqrt{R_1 R_2}\sin^2\left(\frac{\phi}{2}\right)} \quad (2)$$

where $R_1$ and $R_2$ are the reflectivities at the front and back surfaces of the detector, respectively, and (1-A) is the absorptivity per single pass through the detector; given by the relation $1-A = 1 - e^{-\alpha d}$, where $\alpha$ is the absorption coefficient of the detector. Similarly, the total transmitted intensity $I_t$ is given by:

$$\frac{I_t}{I_i} = \frac{A(1 - R_1)(1 - R_2)}{(1 - A\sqrt{R_1 R_2})^2 + 4A\sqrt{R_1 R_2}\sin^2\left(\frac{\phi}{2}\right)} \quad (3)$$

Assuming there are no losses at the surfaces of the detector, conservation of energy applies:

$$\frac{I_t}{I_i} + \frac{I_r}{I_i} + \frac{I_a}{I_i} = 1 \quad (4)$$

where $I_a$ is the total intensity absorbed by the detector. Using Equations (2), (3), and (4), the relationship for the total fractional intensity absorbed by the detector is obtained:

$$\frac{I_a}{I_i} = \frac{(1 - R_1)(1 + AR_2)(1 - A)}{(1 - A\sqrt{R_1 R_2})^2 + 4A\sqrt{R_1 R_2}\sin^2\left(\frac{\phi}{2}\right)} \quad (5)$$

At resonance, where $\phi = 2m\Pi$, these relationships will reduce to:

$$\frac{I_t}{I_i} = \frac{A(1 - R_1)(1 - R_2)}{(1 - A\sqrt{R_1 R_2})^2} \quad (6)$$

$$\frac{I_a}{I_i} = \frac{(1 - R_1)(1 + AR_2)(1 - A)}{(1 - A\sqrt{R_1 R_2})^2} \quad (7)$$

$$\frac{I_r}{I_i} = \frac{(\sqrt{R_1} - A\sqrt{R_2})^2}{(1 - A\sqrt{R_1 R_2})^2} \quad (8)$$

The finesses of the resonant detector, as well as the total power absorbed, is enhanced by metalizing the back surface for 100% reflection. With $R_2 = 1$, $I_t$ will be zero, and the fractional intensity absorbed by the detector will be:

$$\frac{I_a}{I_i} = \frac{(1 - R)(1 - A^2)}{(1 - A\sqrt{R})^2} \quad (9)$$

where $R = R_1$, the reflectivity of the front surface. From equation (9) it can be seen that $I_a/I_i$ can be made equal to unity if and only if:

$$R = A^2 \quad (10)$$

This is the essential condition for "tuned reflectance" in the resonant photodetector.

Figure 3:
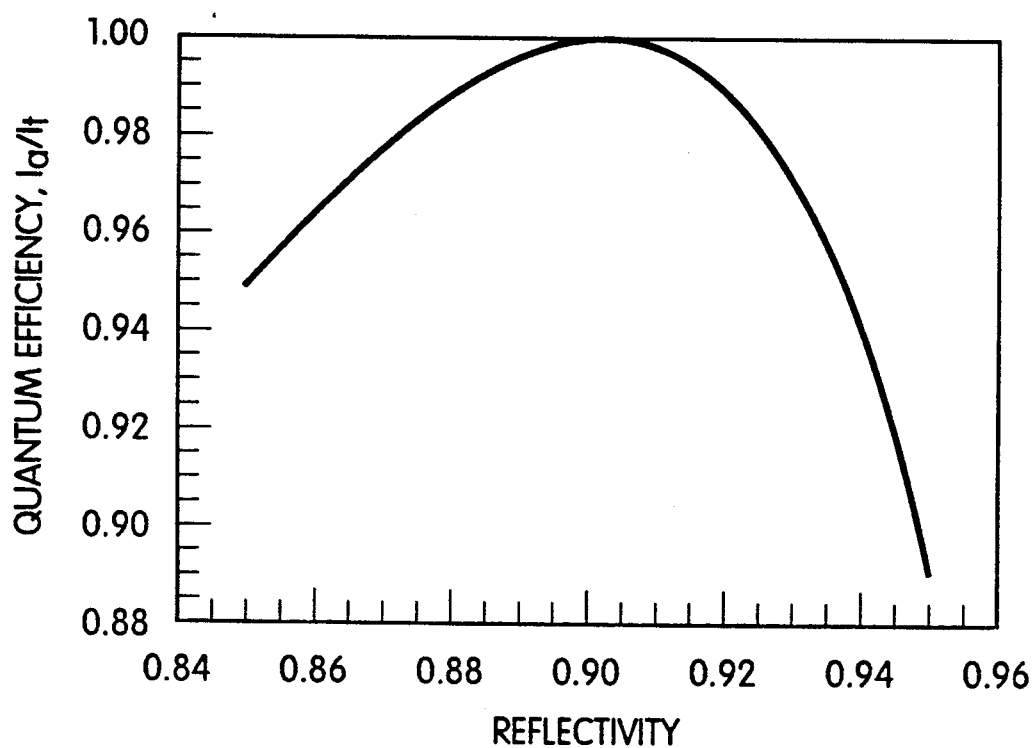
FIG. 3 is a graph of the total fractional power absorbed versus front surface reflectivity for detectors having various surface reflectivities for a given detector absorptivity per single pass through the detector.

It follows from Equation (8) as well as the conservation of energy that under the condition of Equation (10), $I_r/I_i$, which is the total fractional intensity reflected by the detector, is zero. Both R and A can be controlled. For example, in a semiconductor with metal reflectors, R can be controlled by partially metalizing the front surface, and A can be controlled by changing the dopant concentration. FIG. 3 is a plot of $I_a/I_i$ for A=0.95, when the detector absorbs 5% of the incident radiation at a chosen wavelength per single pass through the detector.

Since other absorption mechanisms are negligible compared to the photoconductive absorption, $I_a/I_i$ is, in fact, equivalent to the quantum efficiency $\eta$. Therefore, once R and A are chosen so that Equation (10) is satisfied, the detector should exhibit unit quantum efficiency at resonant frequencies regardless of the thickness or single-pass absorption thereof. This property allows the detector of the present invention to be made very thin, thereby enhancing the photoconductive gain. The photoconductive gain G, which is defined as the ratio of the number of free carriers passing around the circuit to the number of the photons absorbed, can be written in terms of the mobility $\mu$, the electric field strength E, the carrier lifetime $\tau$, and the interelectrode distance d as follows:

$$G = \frac{\mu E \tau}{d} \qquad (11)$$

In a conventional photoconductor, in order to attain a high quantum efficiency, the thickness of the infrared-active layer must be comparable to its absorption length. However, with the detector of the present invention, it is no longer necessary to satisfy the criterion since unit quantum efficiency is insured by virtue of the resonant characteristics of the detector. It is, therefore, possible to thin down the infrared-active layer to a fraction of the absorption length thereof and use the metalized front and back surfaces as the electrodes for applying the bias field. Using this approach, an order of magnitude increase in the photoconductive gain is easily realizable since, from Equation (11), the photoconductive gain is inversely proportional to the interelectrode distance.

The current responsivity $R_i$ can be substantially improved over a conventional photodetector since $R_i$ is directly proportional to the quantum efficiency and the photoconductive gain, i.e., $$R_i = \frac{eG\eta}{h\nu} \qquad (12)$$

where e is the electronic charge, h is the Plank constant, and v is the frequency. In an integrated array, where the system is generally amplifier-noise limited, an increase in the detector responsivity is directly translated into lower system Noise Equivalent Power (NEP). In addition, the NEP of the detector of the present invention can be improved by lowering the dopant concentration in the infrared-active layer without having to pay the penalty of lower quantum efficiency. A thinner infrared-active layer also reduces the susceptibility to ionizing radiation.

The thickness d of the infrared-active layer is determined by the desired vacuum wavelength $\lambda_0$, the refractive index of the infrared-active layer n, and the desired optical bandwidth of the detector which is determined by the integer m in the relationship:

$$d = \frac{m\lambda_0}{2n} \qquad (13)$$

By using a front surface reflective layer having properly tuned reflectivity with respect to the absorptivity of the infrared-active layer, it is possible to produce a thinner detector having a quantum efficiency of at least 0.30 which is comparable to what is achieved by known detectors, and the detector of the present invention has a quantum efficiency of greater than 0.50. Theoretically, it is possible to produce a detector of exactly 1.0 quantum efficiency.

The detector of the present invention can be used in a variety of applications. For example, the detector can be used in an infrared spectrograph in which a relatively large size detector is slightly wedged in one dimension, i.e. the front and back reflective faces are not parallel but are at a slight angle to one another so that the thickness at one end is slightly less than the thickness at the other end. The detector is then "pixelized" into several elements in the x and y dimensions.

Individual wires are attached to each "element" and fed independently to the readout circuitry. These wires can be a monolithic part of the array generated in the photolithographic process. In this fashion the detector would constitute an array whose elements are resonant at slightly different frequencies. The wedge across each individual element is not large enough to degrade its finesse, but the entire array would exhibit a relatively broad response. Since the front surface reflectivity and the absorptivity of the detector are coupled parameters, the reflectivity cannot be uniform across the two dimensions of the array. The reflectivity, therefore, is different for each element to satisfy Equation (10) at different frequencies. Such an array is useful in an infrared spectrograph where each detector element in the array must selectively detect a narrow spectral band.

The detector of the present invention can also be used in a broadband detector in a fashion similar to an infrared spectrograph. Again a relatively large size of detector is slightly wedged in one dimension. Each small area on the detector resonates at a slightly different frequency. As with the spectrograph, Equation (10) dictates that the front surface reflectivity has to take different values across the detector surface so that Equation (10) is satisfied at different frequencies. Unlike the spectrograph, however, the detector is not pixelized, i.e., divided into smaller elements, but is rather treated as a single element.

In addition, the detector can be used in a dispersive detector system in which the incident radiation is externally dispersed using some optical device such as a diffraction grating. The dispersed beam is then intercepted by the detector array which extracts the spectral information out of the incident radiation. Even an ideal diffraction grating is an inefficient device since much of the incoming radiation is lost to the zero$^{th}$ diffracted order and is not used by the detector array. Using the resonant approach, one can design a dispersive detector system that eliminates the need for an external device to disperse the beam. In addition, the system collects radiation with unit quantum efficiency.

In this spectrograph, each element of the array is essentially 100% absorptive at selected frequencies and essentially 100% reflective everywhere else in the frequency domain. A 100% reflective surface is placed facing the array separated by a small distance. The incident radiation is collimated and condensed to fill an area not larger than a single element of the array and is directed towards the first element of the array. The radiation is totally absorbed by this element at its resonant frequencies and is essentially 100% reflected elsewhere in the active frequency range of the detector. The reflected beam goes through a total reflection at the mirror surface heading back towards the array. If the detector array and the mirror are properly tuned, the beam, after its reflection off the mirror surface, will fall on the second element of the array.

A more general and efficient variation of this scheme is to use a second detector array in place of the 100% reflective mirror. The resonant frequency of the second array should be shifted with respect to the first one to provide a complementary frequency coverage. In this case the detection process takes place at every reflection since the second array also contributes to the detection of radiation. The added advantage is that, for the same frequency-range coverage, the number of reflections are half as many and, therefore, the reflection losses are minimized.

The detector of the present invention has particular utility in the field of gallium-doped-germanium (Ge:Ga) far infrared detectors. Ge:Ga detectors exhibit extended long-wavelength response beyond their normal cut off by application of uniaxial stress. The stress must be applied along the [100] direction. On a conventional Ge:Ga detector, with a typical size of 1 mm$^3$, an external mechanical device is used to apply stress. The design of a stressing mechanism is very critical since nonuniform stress breaks the detector element.

Because the stress along one axis is equivalent to tension along the other two orthogonal axes, a resonant Ge:Ga detector can provide extended long wavelength response, when tension is applied along the axes orthogonal to the [100] axis simultaneously. This method is feasible for the detector of the present invention, because the detector is very thin and the amount of tension required is relatively low.

One way of applying tension is to mount the detector on a substrate whose expansion coefficient is lower than that of germanium. At room temperature, where the detector is mounted, there is no stress or tension so there is no chance of breaking the detector. As the detector and the substrate are cooled down to the operating temperature, the detector shrinks more than the substrate and experiences a gradual and uniform tension along the two orthogonal axes which are in contact with the substrate. This method has the added advantage that no mechanical device is needed to apply the tension making the technique more attractive for a multi-element detector array.

The present invention will now be further described with reference to the following example:

EXAMPLE

Production of a resonant infrared detector

An initial cut is made of a wafer of germanium semiconductor having the proper doping characteristics (Ga concentration near $2 \times 10^{14} cm^{-3}$) to a thickness of about 100 μm. This wafer is then chemi-mechanically polished on both sides until it is reduced to a thickness of $50 \pm 5$ μm and has a surface parallelism of better than 2.5 μm/cm. To form the transparent contacts, both surfaces of the thinned Ge wafer are then ion-implanted with boron ions at an energy of 25keV and an implant dose of approximately $10^{14} cm^{-2}$. The wafer is then annealed in a furnace at near 120° C. for a period of about one hour under flowing pure nitrogen gas. One side of the wafer is metalized with a thick layer of gold to provide both a 100% reflecting back surface and the back electrical contact. The opposite side is metalized to a specific thickness so that its reflectivity is tuned to the single pass absorptivity of the detector. Wire leads are attached for electrical connection to the external measurement electronics.

Although the present invention has been described relative to specific exemplary embodiments thereof, it will be understood by those skilled in the art that variations and modifications can be effected in these exemplary embodiments without departing from the scope and spirit of the invention.

What is claimed is:

1. A resonant infrared detector comprising:
   an infrared-active layer for absorbing radiation of a given wavelength and including first and second parallel faces;
   a first reflective layer, disposed opposite said first parallel face of said infrared-active layer and having a reflectivity tuned to the absorptivity of said infrared-active layer, for reflecting a specific portion of radiation incident on said first reflective layer during each pass of said radiation through said detector and for allowing a specific portion of said incident radiation at said given wavelength to reach said infrared-active layer; and
   a second reflective layer, disposed opposite said second parallel face of said infrared-active layer, for reflecting back into said infrared-active layer substantially all of the radiation at said given wavelength that passes through said infrared-active layer, whereby said first and second reflective layers increase the quantum, efficiency of said infrared detector relative to the quantum efficiency of said infrared-active layer alone,
   wherein said first reflective layer has a reflectivity R and said infrared-active layer has an absorptivity (1-A) per single pass of radiation through said infrared-active layer, and R and A substantially satisfy the following equation:

$$R = A^2.$$

2. An infrared detector according to claim 1, wherein said infrared detector has a quantum efficiency of greater than about 0.30.

3. An infrared detector according to claim 1, wherein said infrared detector has a quantum efficiency of greater than 0.50.

4. An infrared detector according to claim 1, wherein said infrared detector has a calculated quantum efficiency of exactly 1.0 when $R = A^2$.

5. An infrared detector according to claim 1, wherein said infrared detector includes an electrical contact at each of said first and second faces of said infrared-active layer for applying an electrical field across said infrared detector.

6. An infrared detector according to claim 5, wherein each of said electrical contacts comprises an electrically conductive layer which is nonabsorbing of incident radiation said given wavelength.

7. An infrared detector according to claim 1, wherein said infrared-active layer comprises germanium.

8. An infrared detector according to claim 1, wherein said infrared-active layer comprises gallium-doped germanium.

9. An infrared detector according to claim 1, wherein said infrared-active layer comprises silicon.

10. An infrared detector according to claim 1, wherein said infrared-active layer is produced by depositing a thin film of an infrared-active material on a substrate.

11. A resonant infrared detector, comprising:
an infrared active layer having top and bottom surfaces and an absorptivity (1-A) per single pass of radiation through said infrared active layer;
a first reflective layer having a reflectivity R, disposed on said top surface of said infrared active layer; and
a second reflective layer, disposed on said bottom surface of said infrared active layer,
wherein R and A substantially satisfy an equation: $R=A^2$ to obtain tuned reflectance in the resonant infrared detector.

12. A resonant infrared detector according to claim 11, wherein the resonant infrared detector absorbs said radiation at a fractional intensity according to:

$$\frac{(1-R)(1-A^2)}{(1-A\sqrt{R})^2}.$$

13. A resonant infrared detector according to claim 12,
wherein the resonant infrared detector operates at a quantum efficiency, and
wherein said fractional intensity is substantially equivalent to said quantum efficiency.

14. A resonant infrared detector according to claim 12,
wherein when the resonant infrared detector obtains tuned reflectance, the resonant infrared detector operates substantially at a unit quantum efficiency, and
wherein said fractional intensity is substantially equivalent to said unit quantum efficiency.

15. A resonant infrared detector according to claim 11,
wherein the infrared active layer has a thickness and absorption length, and
wherein the resonant infrared detector does not require said thickness to be as large as said absorption length to obtain said tuned reflectance.

16. A method of reflecting radiation using a resonant infrared detector, comprising the steps of:
(a) reflecting, using a first reflective layer having a reflectivity R, a first portion of the radiation during each pass of the radiation through the resonant infrared detector, and transmitted a second portion of the radiation through the first reflective layer;
(b) absorbing a first part of the second portion of the radiation through an infrared active layer having an absorptivity (1-A) per single pass of radiation through the infrared active layer, and transmitting a second part of the second portion of the radiation through the infrared active layer; and
(c) reflecting, using a second reflective layer, substantially all of the second part of the second portion of the radiation transmitted in said absorbing step (b) back into the infrared active layer,
wherein R and A substantially satisfy an equation: $R=A^2$ to obtain tuned reflectance in the resonant infrared detector.

17. A method according to claim 15, wherein said absorbing step (b) absorbs the radiation at a fractional intensity $$\frac{(1-R)(1-A^2)}{(1-A\sqrt{R})^2}.$$

18. A method according to claim 16,
wherein the resonant infrared detector operates substantially at a quantum efficiency, and
wherein the fractional intensity is substantially equivalent to the quantum efficiency.

19. A method according to claim 16,
wherein when the resonant infrared detector obtains tuned reflectance, the resonant infrared detector operated substantially at a unit quantum efficiency, and
wherein the fractional intensity is substantially equivalent to the unit quantum efficiency.

20. A method according to claim 15,
wherein the infrared active layer has a thickness and absorption length, and
wherein the resonant infrared detector does not require the thickness to be as large as the absorption length to obtain the tuned reflectance.

21. A method of reflecting radiation using a resonant infrared detector, comprising the steps of:
(a) reflecting, according to a reflectivity R, a first portion of the radiation during each pass of the radiation through the resonant infrared detector, and transmitting a second portion of the radiation;
(b) absorbing a first part of the second portion of the radiation transmitted in said reflecting step (a) according to an absorptivity (1-A), and transmitting a second part of the second portion of the radiation; and
(c) reflecting substantially all of the second part of the second portion of the radiation transmitted in said absorbing step (b)
wherein R and A substantially satisfy an equation: $R=A^2$ to obtain tuned reflectance in the resonant infrared detector.

* * * * *